United States Patent
Onishi et al.

(10) Patent No.: US 8,054,641 B2
(45) Date of Patent: Nov. 8, 2011

(54) ELECTRONIC UNIT

(75) Inventors: Hiroyuki Onishi, Aichi-ken (JP); Toshiaki Nagase, Aichi-ken (JP); Jun Ishikawa, Kariya (JP); Naohito Kanie, Kariya (JP); Kazuyoshi Kontani, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 248 days.

(21) Appl. No.: 12/397,062

(22) Filed: Mar. 3, 2009

(65) Prior Publication Data
US 2009/0225523 A1   Sep. 10, 2009

(30) Foreign Application Priority Data
Mar. 4, 2008  (JP) ................. 2008-054046

(51) Int. Cl.
*H05K 5/00* (2006.01)
(52) U.S. Cl. .................................................. 361/752
(58) Field of Classification Search .............. 361/752, 361/785
See application file for complete search history.

(56) References Cited

U.S. PATENT DOCUMENTS

| | | | | |
|---|---|---|---|---|
| 5,907,475 A | * | 5/1999 | Babinski et al. | 361/719 |
| 6,496,384 B1 | * | 12/2002 | Morales et al. | 361/784 |
| 6,932,617 B2 | * | 8/2005 | Debord et al. | 439/65 |
| 7,283,374 B2 | * | 10/2007 | Pedoeem et al. | 361/796 |
| 2006/0255448 A1 | * | 11/2006 | Nagase et al. | 257/692 |

FOREIGN PATENT DOCUMENTS

| | | |
|---|---|---|
| JP | 2000-228492 A | 8/2000 |
| JP | 2003-078107 A | 3/2003 |
| JP | 2006-066572 A | 3/2006 |

* cited by examiner

*Primary Examiner* — Nabil El Hady
*Assistant Examiner* — Abiy Getachew
(74) *Attorney, Agent, or Firm* — Woodcock Washburn LLP (57) ABSTRACT

An electronic unit includes a first circuit board having a power semiconductor device and an electrolytic capacitor and a second circuit board having an electronic component to control the power semiconductor device. The second circuit board is arranged perpendicular to the first circuit board and along the surface of the electrolytic capacitor. The electronic unit further includes a connecting member being jointed at one end thereof to the first circuit board and jointed at the other end thereof to the second circuit board for electrical connection between the first and second circuit boards.

6 Claims, 7 Drawing Sheets

ELECTRONIC UNIT

CROSS REFERENCE TO RELATED APPLICATION

This application claims priority to Japanese Patent Application No. 2008-054046 filed Mar. 4, 2008.

BACKGROUND

The present invention relates to an electronic unit.

In an electronic unit such as an inverter, a power semiconductor device serving as a switching device is operated under the control of a control circuit. In a known electronic unit disclosed, for example, in Japanese Unexamined Patent Application Publication No. 2000-228492, a circuit board having a control circuit thereon is disposed above the power semiconductor device.

Figure 9:
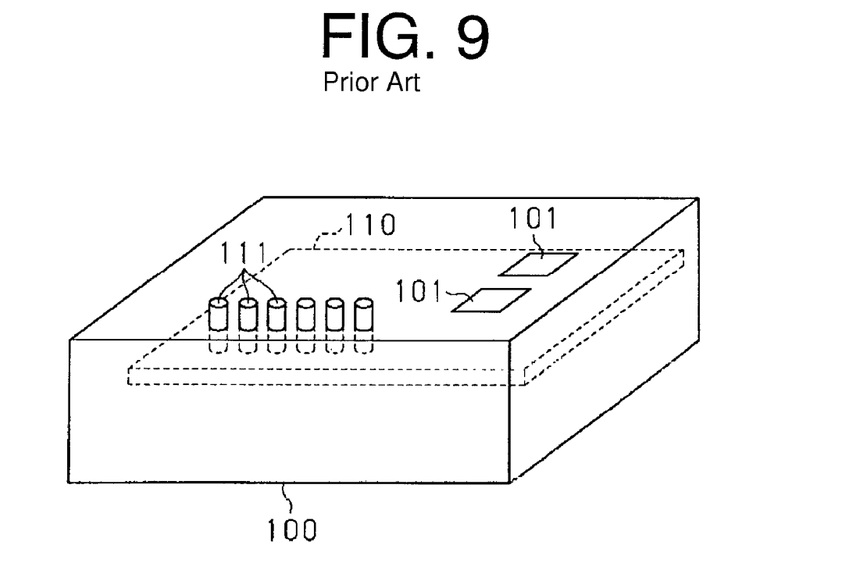
FIG. 9 is a perspective view of an electronic unit as a background art.
Figure 10:
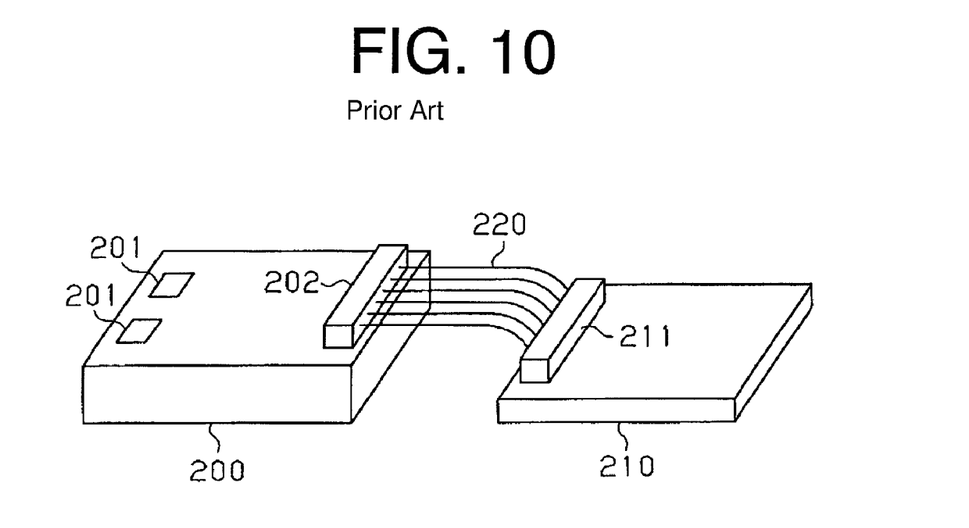
FIG. 10 is a perspective view of another electronic unit as a background art.

FIGS. 9 and 10 show examples of the electronic unit as a background art. Referring to FIG. 9, a circuit board 110 is built into a semiconductor power module 100 which incorporates power semiconductor devices (not shown). The circuit board 110 is disposed in the vicinity of the power semiconductor device. Power terminals 101 and signal terminals 111 are disposed on the upper surface of the semiconductor power module 100. Referring to FIG. 10, a circuit board 210 is provided separately of a semiconductor power module 200. The semiconductor power module 200 and the circuit board 210 are electrically connected via connectors 202 and 211 and electric wires 220. Power terminals 201 are disposed on the upper surface of the semiconductor power module 200.

In the electronic unit of FIG. 9, since the circuit board 10 is affected by heat generated by the power semiconductor device, type of electronic components to be mounted on the circuit board 110 is limited. Therefore, some types of electronic components such as CPU possibly cannot be mounted on the circuit board 110. In addition, the circuit board 110 is affected also by noise generated due to large amount of current flowing through the power semiconductor device. Therefore, a noise shield such as an aluminum plate needs to be provided between the circuit board 110 and the power semiconductor device for protecting circuits and electronic components on the circuit board 110 from the noise. Further, a power capacitor needs to be connected to the power terminals 101 outside the semiconductor power module 100, resulting in enlargement of the size of the electronic unit.

In the electronic unit of FIG. 10, on the other hand, since the semiconductor power module 200 and the circuit board 210 are connected via the connectors 202 and 211 and the electric wires 220, disconnection or contact failure may occur in electric connections. In addition, since the semiconductor power module 200 is provided separately of the circuit board 210, the size of the electronic unit is enlarged. Further, a power capacitor needs to be connected to the power terminals 201 outside the semiconductor power module 200, resulting in enlargement of the size of the electronic unit.

The present invention is directed to providing an electronic unit that allows electronic components thereof to be less affected by heat or noise and offers more reliable electric connection without enlarging the size of the unit.

SUMMARY

In accordance with an aspect of the present invention, an electronic unit includes a first circuit board having a power semiconductor device and an electrolytic capacitor and a second circuit board having an electronic component to control the power semiconductor device. The second circuit board is arranged perpendicular to the first circuit board and along the surface of the electrolytic capacitor. The electronic unit further includes a connecting member being jointed at one end thereof to the first circuit board and jointed at the other end thereof to the second circuit board for electrical connection between the first and second circuit boards.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF ILLUSTRATIVE EMBODIMENTS

The following will describe an electronic unit according to the first embodiment of the present invention with reference to FIGS. 1 through 5.

Figure 5:
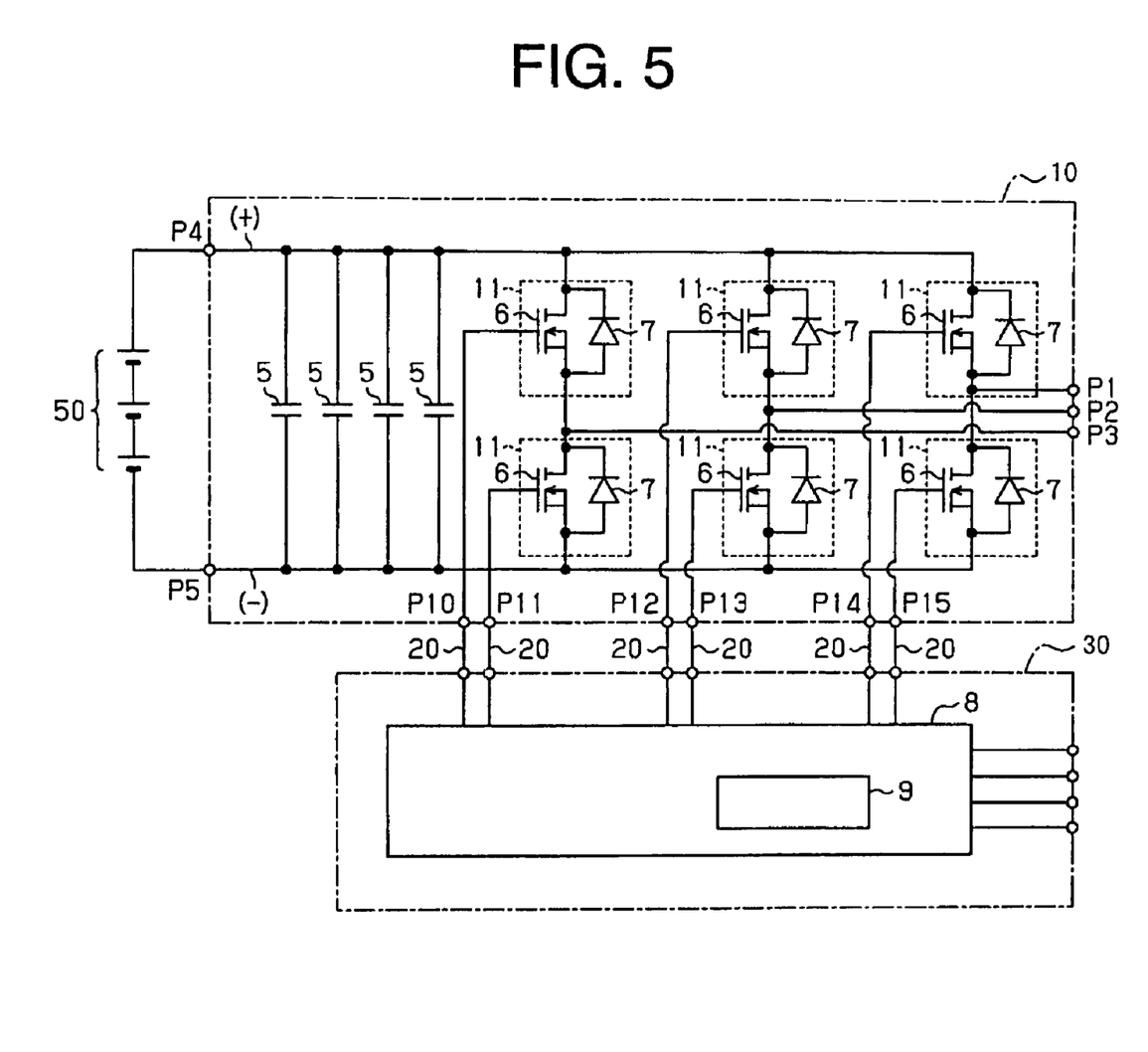
FIG. 5 is a schematic diagram of a circuit of the electronic unit.

The electronic unit is a three-phase inverter to drive a vehicle driving motor. Referring to FIG. 5, the electronic unit includes terminals P1, P2, P3, P4 and P5 to be connected to external devices. The terminals P4 and P5 are connected to a vehicle battery 50.

Four power capacitors 5, which serve as smoothing capacitors, and three pairs of serially connected power MOSFETs 6 are connected in parallel between the terminals P4 and P5. Each power MOSFET 6 is connected to a flywheel diode 7 in parallel. Nodes between the respective paired power MOSFETs 6 are connected to the terminals P1, P2 and P3. The terminals P1, P2 and P3 are connected to a three-phase induction motor as the vehicle driving motor. The terminals P1, P2 and P3 correspond to outputs of U phase, V phase and W phase respectively. The gate electrodes of power MOSFETs 6 are connected to the terminals P10, P11, P12, P13, P14 and P15. An IGBT may be applied as a substitute for the power MOSFET 6.

A control circuit 8 including a microcomputer 9 and a driver (not shown) is connected to the terminals P10, P11, P12, P13, P14 and P15. The control circuit 8 operates the power MOSFETs 6 by the driver under the control of the microcomputer 9. Specifically, each power MOSFET 6 is operated so as to perform switching operation for driving the vehicle driving motor by controlling the gate potential.

Figure 4:
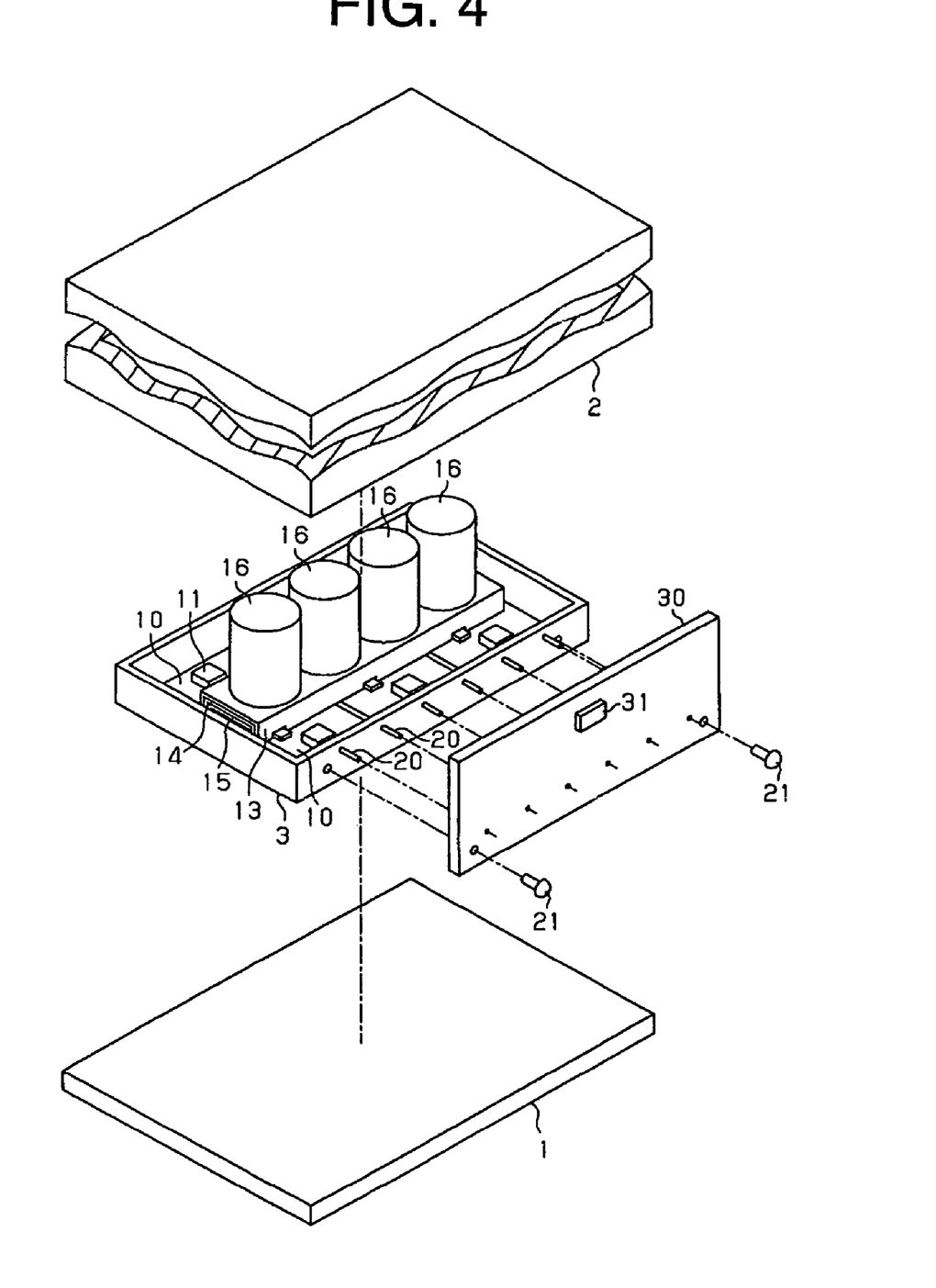
FIG. 4 is an exploded perspective view of the electronic unit.

Referring to FIG. 4, the electronic unit includes a rectangular base plate 1 and a box-shaped cover 2. The base plate 1 and the cover 2 cooperate to form a housing for the electronic unit. In the assembled state of the electronic unit, the bottom opening of the cover 2 is closed by the base plate 1. The base plate 1 is made of a material having high thermal conductivity such as aluminum or copper. The base plate 1 serves as a heatsink.

Figure 1:
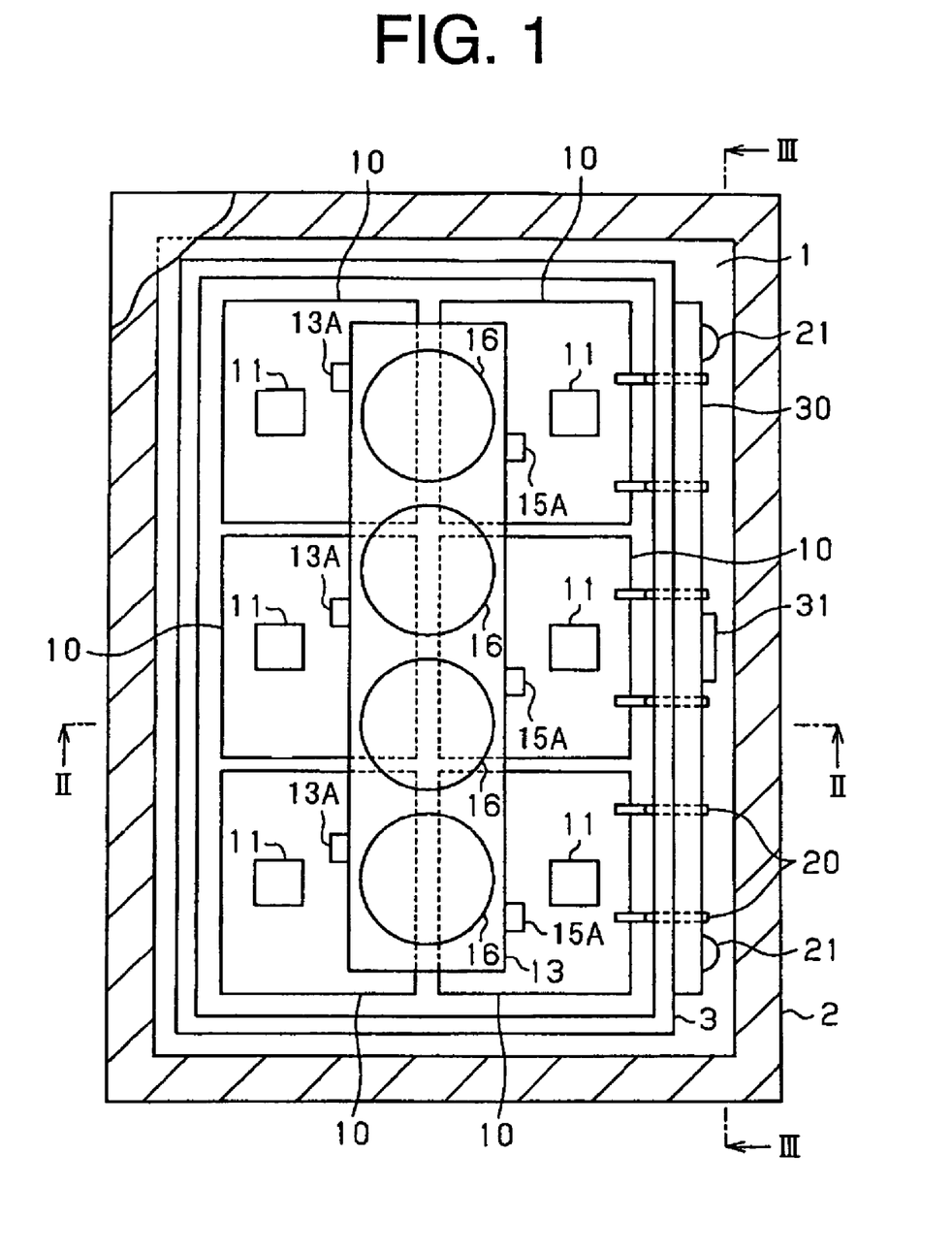
FIG. 1 is a plan view of an electronic unit according to a first embodiment of the present invention.
Figure 2:
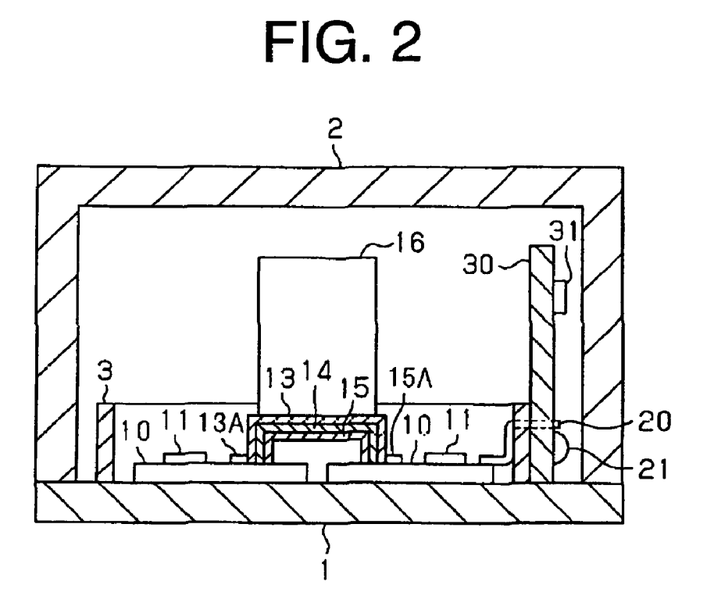
FIG. 2 is a cross-sectional view taken along the line II-II of FIG. 1.

Referring to FIGS. 1 and 2, six first circuit boards 10 are mounted on the upper surface of the base plate 1 by soldering. Specifically, the six first circuit boards 10 are arranged in three rows and two columns on the base plate 1. Each first circuit board 10 is made by fixing a layer of copper or aluminum on both upper and lower surfaces of a ceramic substrate. The layer on the upper surface of the ceramic substrate is formed conductive patterns, and the layer on the lower surface of the ceramic substrate is soldered to the base plate 1. The conductive patterns of each first circuit board 10 are electrically connected to the conductive patterns of the other first circuit board 10 by bonding wires (not shown).

A semiconductor chip 11 (a power semiconductor device) is mounted on the upper surface of each first circuit board 10. The semiconductor chip 11 has the power MOSFET 6 and the flywheel diode 7 (see FIG. 5) in combination as one-chip device. The semiconductor chip 11 is soldered to the conductive patterns of the first circuit board 10 and electrically connected to the conductive patterns by bonding wires (not shown). The power MOSFET 6 and the flywheel diode 7 may be provided as discrete devices or in a module.

Conductive members 13 and 15 are disposed on the upper surfaces of the first circuit boards 10. The conductive members 13 and 15 extend in longitudinal direction of the base plate 1 and have a cross section in the form of a channel. The conductive members 13 and 15 sandwich an insulation sheet 14 therebetween to form a laminate. The conductive members 13 and 15 include connecting portions 13A and 15A at the lower ends thereof, respectively. The conductive members 13 and 15 are located so as to bridge across over the upper surfaces of the paired first circuit boards 10 of each row.

Four electrolytic capacitors 16 serving as the power capacitors 5 of FIG. 5 are arranged in line on the upper surface of the conductive member 13. Each electrolytic capacitor 16 has a cylindrical shape and is disposed upright on the conductive member 13. The negative terminal of the electrolytic capacitor 16 is electrically connected to the conductive member 13, and the positive terminal the electrolytic capacitor 16 is electrically connected to the conductive member 15. The connecting portions 13A and 15A of the conductive members 13 and 15 are electrically connected to the conductive patterns of the first circuit boards 10. Each of the conductive members 13 and 15 serves as a parallel plate type member for electrically connecting the electrolytic capacitors 16 and the first circuit boards 10.

As described above, the semiconductor chips 11 and the electrolytic capacitors 16 are mounted on the first circuit boards 10.

Referring to FIGS. 1 and 2, the first circuit boards 10 mounted on the base plate 1 are surrounded by a rectangular frame 3. The rectangular frame 3 is made of a resin and fixedly mounted on the upper surface of the base plate 1. A second circuit board 30 is disposed upright on the base plate 1 outside the rectangular frame 3. The second circuit board 30 is composed of a printed circuit board and serves as the control circuit 8 of FIG. 5. The second circuit board 30 is fixedly mounted to the rectangular frame 3 by two screws 21. Specifically, the screws 21 extend through the second circuit board 30 and screwed into the rectangular frame 3.

Figure 3:
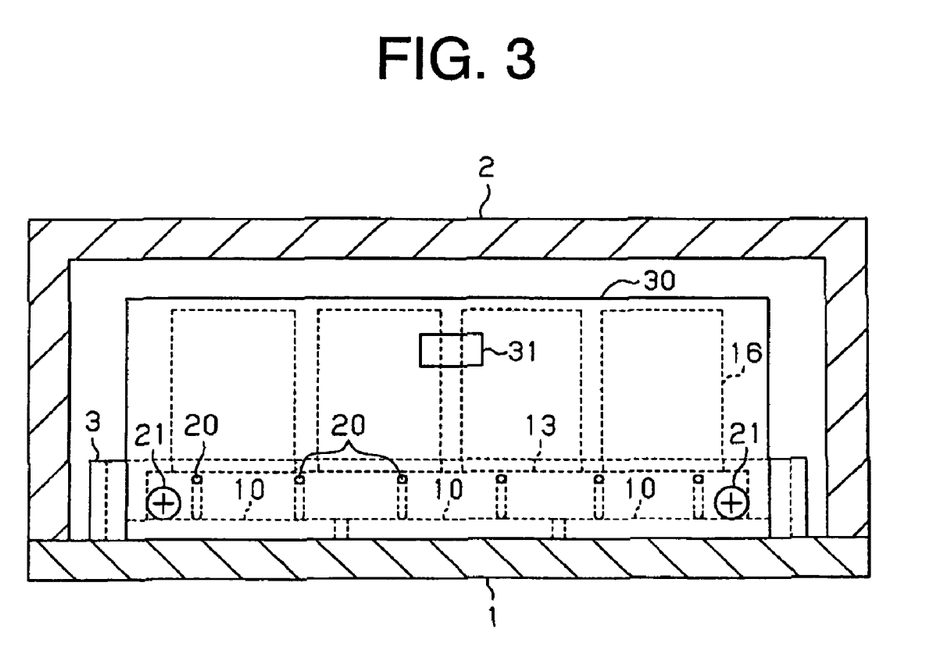
FIG. 3 is a cross-sectional view taken along the line III-III of FIG. 1.

Referring to FIGS. 1 through 3, the second circuit board 30 mounts various electronic components constituting the control circuit 8 of FIG. 5. Specifically, in this embodiment, a microcomputer chip 31 is mounted to constitute the microcomputer 9 of the control circuit 8.

The rectangular frame 3 is molded integrally with plural lead pins 20. Each lead pin 20 (a connecting member) projects inward of the rectangular frame 3 and jointed at one end thereof to the conductive pattern of the first circuit board 10. Part of the lead pin 20 adjacent to the one end thereof is bent in a crank shape, as shown in FIG. 2. The lead pin 20 projects outward of the rectangular frame 3 and extends through the second circuit board 30. The lead pin 20 is jointed to the conductive pattern on the opposite surface of the second circuit board 30. Thus, the first and second circuit boards 10 and 30 are electrically connected via the lead pins 20. That is, the second circuit board 30 disposed upright is jointed to the lead pins 20 extending laterally from the first circuit boards 10.

As described above, the second circuit board 30 is arranged substantially perpendicular to the first circuit boards 10 and along the side surface of the electrolytic capacitors 16. The height of the electrolytic capacitors 16 arranged on the first circuit boards 10 on the base plate 1 is substantially equal to the height of the second circuit board 30 mounted on the base plate 1 via the rectangular frame 3.

The terminals P1, P2, P3, P4 and P5 (see FIG. 5) of the electronic unit are electrically connected to external devices via connectors (not shown) provided in the cover 2.

The following will describe the operation of the electronic unit according to the first embodiment.

Referring to FIG. 5, the first and second circuit boards 10 and 30 are electrically connected via the lead pins 20. The gate potential of each power MOSFET 6 on the first circuit boards 10 is controlled by the control circuit 8 on the second circuit board 30, so that the power MOSFETs 6 each performs switching operation. Since current then flows through the power MOSFETs 6 and the flywheel diodes 7, heat is generated by the power MOSFETs 6 and the flywheel diodes 7, and noise is generated by the switching operation of the power MOSFETs 6. The heat is then transferred from the semiconductor chips 11 through the first circuit boards 10 to the base plate 1 and radiated from the base plate 1 into the atmosphere.

As shown in FIG. 2, the second circuit board 30 is arranged substantially perpendicular to the first circuit boards 10 and along the side surface of the electrolytic capacitors 16. Therefore, the first circuit boards 10 are spaced away from the second circuit board 30 for a longer distance, as compared to a case wherein the second circuit board 30 is disposed over the first circuit boards 10 in parallel relation thereto. As a result, the second circuit board 30 is less affected by the noise from the first circuit boards 10 without using a shield, and various circuits and electronic components on the second circuit board 30 are protected from such noise, accordingly. In addition, since the first circuit boards 10 are spaced away from the second circuit board 30, the second circuit board 30 is less affected by the heat from the first circuit boards 10.

The second circuit board 30 arranged as described above does not enlarge the size of the electronic unit. Specifically, since the electrolytic capacitors 16 are disposed above the first circuit boards 10, the electronic unit essentially requires a space above the first circuit boards 10 for the electrolytic capacitors 16. Therefore, the second circuit board 30 disposed upright adjacent to the first circuit boards 10 does not cause the enlargement of the entire size of the electronic unit.

Each lead pin 20 is jointed at the opposite ends thereof to the first and second circuit boards 10 and 30, respectively, for electrically connecting the first and second circuit boards 10 and 30. In the background art of FIG. 10, on the other hand, since the semiconductor power module 200 is connected to the control circuit 210 via the connectors 202 and 211 and the electric wires 220, disconnection or contact failure may occur. According to the embodiment, however, the first and second circuit boards 10 and 30 are directly connected via the lead pins 20 without using such connectors and electric wires. Therefore, more reliable electric connection between the first and second circuit boards 10 and 30 is achieved, and disconnection or contact failure is prevented, accordingly.

The electronic unit according to the first embodiment offers the following advantages.

(1) The second circuit board 30 is arranged substantially perpendicular to the first circuit boards 10 and along the side surface of the electrolytic capacitors 16. Each lead pin 20 is jointed at one end thereof to the first circuit board 10 and at the other end thereof to the second circuit board 30 for electrically connecting the first and second circuit boards 10 and 30. Therefore, electrical components on the second circuit board 30 are less affected by noise or heat from the first circuit boards 10 and more reliable electric connection is achieved between the first and second circuit boards 10 and 30 without enlarging the size of the electronic unit.

(2) Since the second circuit board 30 is arranged perpendicular to the first circuit boards 10 within the housing of the electronic unit, the first and second circuit boards 10 and 30 are both accommodated in the housing.

(3) Each first circuit board 10 is mounted on the upper surface of the base plate 1, and the second circuit board 30 is disposed upright on the base plate 1. Therefore, heat generated by the semiconductor chip 11 on the first circuit board 10 is transferred through the first circuit board 10 to the base plate 1 and then radiated into the atmosphere.

(4) Since the second circuit board 30 is fixedly mounted to the rectangular frame 3 surrounding the first circuit boards 10 on the base plate 1, the position of the second circuit board 30 is fixed by the rectangular frame 3.

Figure 6:
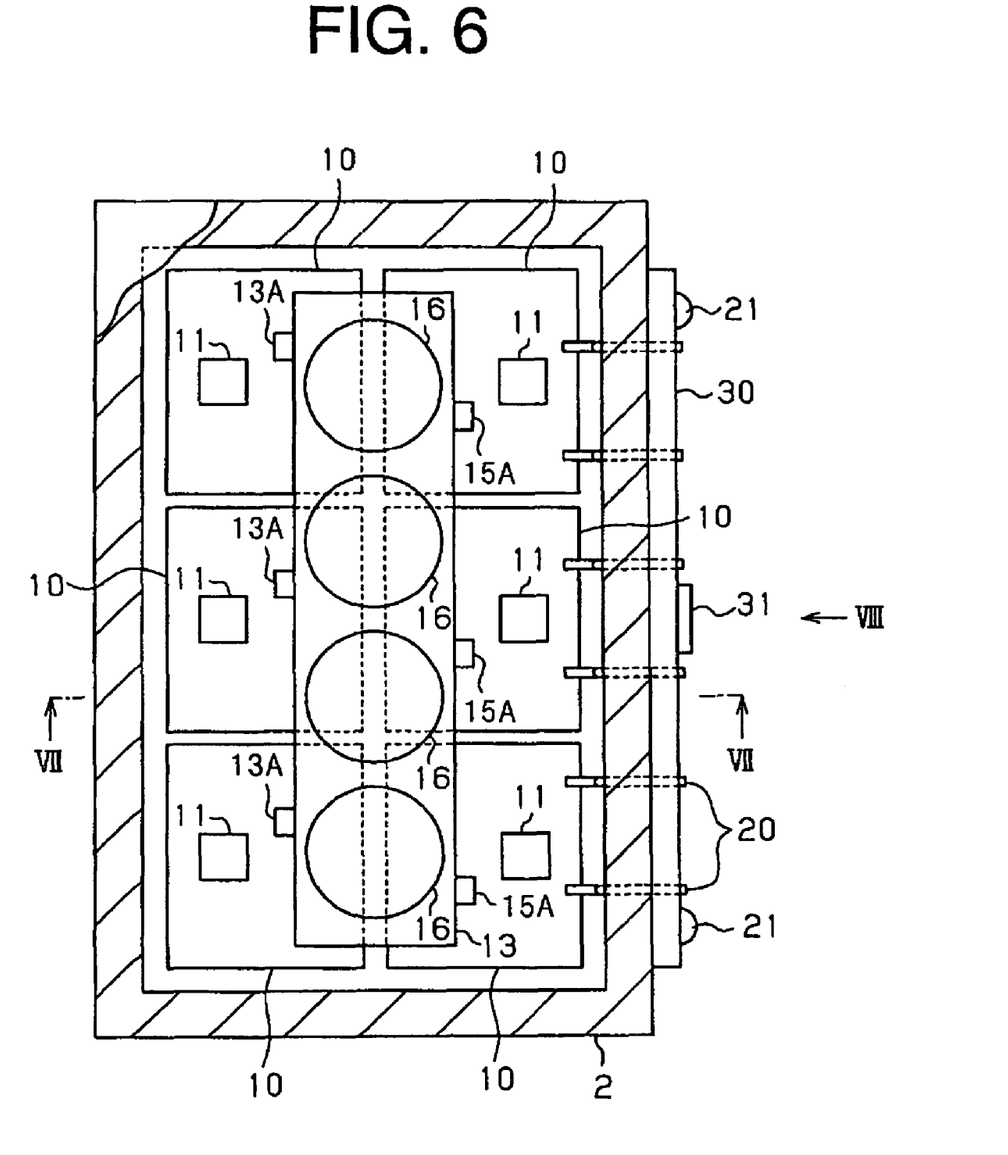
FIG. 6 is a plan view of an electronic unit according to a second embodiment of the present invention.
Figure 7:
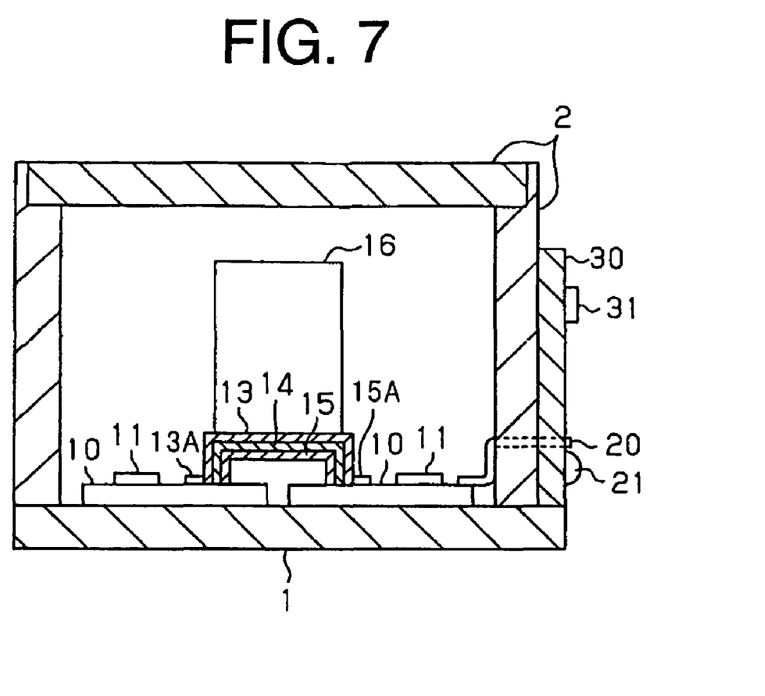
FIG. 7 is a cross-sectional view taken along the line VII-VII of FIG. 6.
Figure 8:
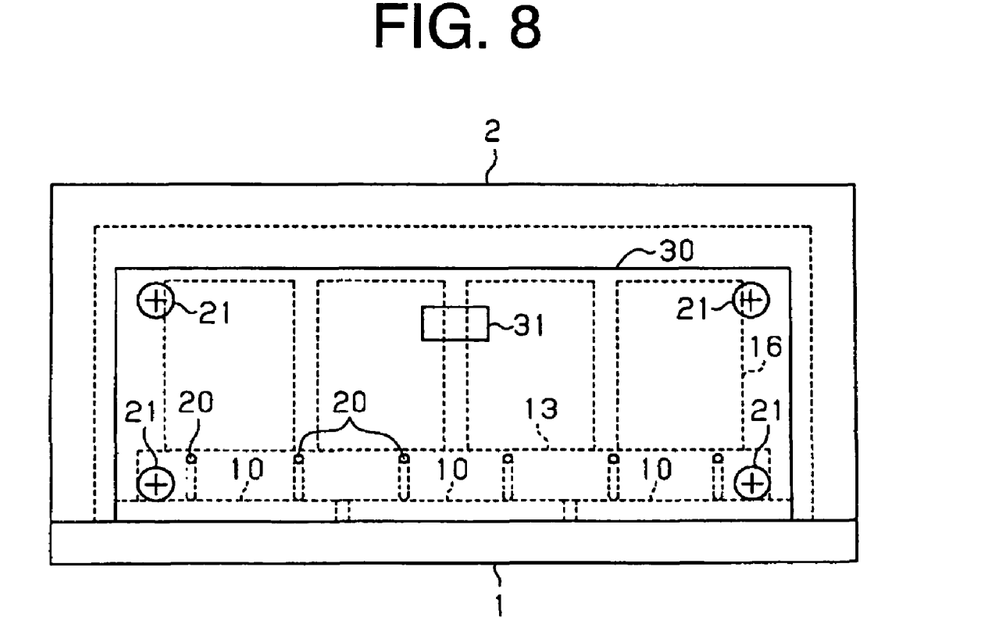
FIG. 8 is a side view as seen in the direction of arrow VIII of FIG. 6.

In the first embodiment, the second circuit board 30 is arranged perpendicular to the first circuit boards 10 within the housing of the electronic unit, but the second circuit board 30 may be arranged outside the housing. FIGS. 6, 7 and 8 show an electronic unit according to the second embodiment of the present invention, wherein the second circuit board 30 is mounted on the outer surface of the cover 2 by the screws 21. That is, the second circuit board 30 is mounted on the outer surface of the housing of the electronic unit. Each lead pin 20 extends from the first circuit board 10 through the wall of the cover 2 and the second circuit board 30, and is soldered to the second circuit board 30. The second circuit board 30 is arranged perpendicular to the first circuit boards 10 and along the side surface of the electrolytic capacitor 16, as in the case of the first embodiment.

The above embodiments may be modified in various ways as exemplified below.

In the embodiments, the six first circuit boards 10 are mounted on the upper surface of the base plate 1, and each first circuit board 10 has one semiconductor chip 11. Alternatively, the number of the first circuit boards 10 or the number of the power semiconductor devices on each first circuit board 10 may be changed as required. For example, one first circuit board 10 having six semiconductor chips 11 may be mounted on the base plate 1.

In the embodiments, the present invention is applied to the inverter as the electronic unit, but it may be applied to a voltage booster circuit. For example, the inverters of the previous embodiments are composed of six arms, wherein one arm is composed of a pair of the power MOSFET 6 (or IGBT) and the flywheel diode 7 of FIG. 5. Alternatively, a step-up and step-down DC-DC converter composed of two arms may be provided.

Therefore, the present examples and embodiments are to be considered as illustrative and not restrictive, and the invention is not to be limited to the details given herein but may be modified within the scope of the appended claims.

What is claimed:

1. An electronic unit, comprising: a first circuit board having a power semiconductor device and an electrolytic capacitor on the upper surface thereof;
   a second circuit board having an electronic component to control the power semiconductor device, the second circuit board being arranged perpendicular to the first circuit board;
   a connecting member being jointed at one end thereof to the first circuit board and jointed at the other end thereof to the second circuit board for electrical connection between the first and second circuit boards; a base plate on which the lower surface of the first circuit board is mounted, the second circuit board being disposed upright on the base plate; and a rectangular frame fixedly mounted on the base plate so as to surround the first circuit board, the second circuit board being mounted to the rectangular frame.

2. The electronic unit according to claim 1, further comprising a housing including the base plate and accommodating therein the first circuit board and the second circuit board.

3. The electronic unit according to claim 1, wherein the connecting member is a lead pin molded integrally with the rectangular frame.

4. The electronic unit according to claim 1, wherein a plurality of the first circuit boards is mounted on the base plate, further comprising a conductive member disposed on the first circuit boards for electrically connecting the electrolytic capacitor and the first circuit boards, the conductive member being located so as to bridge across over the first circuit boards, the electrolytic capacitor being disposed on the conductive member.

5. The electronic unit according to claim 4, wherein the electrolytic capacitor has a cylindrical shape and is disposed upright on the conductive member.

6. The electronic unit according to claim 5, wherein the height of the electrolytic capacitor arranged on the first circuit board is substantially equal to the height of the second circuit board.

* * * * *